United States Patent
Loo

(10) Patent No.: US 8,323,411 B2
(45) Date of Patent: Dec. 4, 2012

(54) SEMICONDUCTOR WORKPIECE APPARATUS

(75) Inventor: John Loo, Round Rock, TX (US)

(73) Assignee: Samsung Austin Semiconductor, L.P., Austin, TX (US)

( * ) Notice: Subject to any disclaimer, the term of this patent is extended or adjusted under 35 U.S.C. 154(b) by 1378 days.

(21) Appl. No.: 11/145,617

(22) Filed: Jun. 6, 2005

(65) Prior Publication Data

US 2005/0230892 A1    Oct. 20, 2005

Related U.S. Application Data

(62) Division of application No. 10/261,368, filed on Sep. 30, 2002, now Pat. No. 6,939,132.

(51) Int. Cl.
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. .............. 118/728; 118/724; 156/345.51

(58) Field of Classification Search ............. 118/728, 118/724; 156/345.51
See application file for complete search history.

(56) References Cited

U.S. PATENT DOCUMENTS

| 4,263,872 A | * | 4/1981 | Ban | 118/721 |
| 5,679,168 A | * | 10/1997 | Porter et al. | 118/725 |
| 5,921,773 A | | 7/1999 | Lee | |
| 5,931,666 A | | 8/1999 | Hengst | |
| 6,206,197 B1 | | 3/2001 | Decamps et al. | |
| 6,340,090 B1 | * | 1/2002 | Jahani et al. | 211/41.1 |
| 6,607,381 B2 | | 8/2003 | Minami et al. | |

FOREIGN PATENT DOCUMENTS

KR    1020020068267 A    8/2002

OTHER PUBLICATIONS

Stanley Middleman et al., "Process Engineering Analysis in Semiconductor Device Fabrication", Jan. 1993, pp. 547-548.
Saint Gobain Semiconductor Components Group; Crystal® Vertical Wafer Boats Web Page; http://www.crystar.com/vertboat.html; 2000; pp. 1-2.
Daniel M. Dobbin; Tube Reactor: Overview; http://www.batnet.com/enigmatics/semiconductor_processing/CVD_Fundamentals/reactors/tube_reactor.html; Dec. 2001; pp. 1-2.

* cited by examiner

*Primary Examiner* — Rudy Zervigon

(57) ABSTRACT

Various embodiments of an apparatus for holding and processing semiconductor workpieces are provided. In one aspect, an apparatus is provided that includes a first base, a second base and three elongated members coupled to and between the first base and the second base. The three elongated members are spatially arranged so that a semiconductor workpiece may be positioned therebetween. Each of the elongated members has a first lateral edge, a second lateral edge and at least one radially inwardly projecting member. The at least one radially inwardly projecting member has a third lateral edge, a fourth lateral edge and an upper surface for receiving a portion of the semiconductor workpiece and a lower surface. The third lateral edge is displaced laterally inward from the first lateral edge and the fourth lateral edge is displaced laterally inward from the second lateral edge.

20 Claims, 5 Drawing Sheets

SEMICONDUCTOR WORKPIECE APPARATUS

This application is a divisional of prior U.S. patent application Ser. No. 10/261,368 filed on Sep. 30, 2002 now U.S. Pat. No. 6,939,132.

BACKGROUND OF THE INVENTION

1. Field of the Invention

This invention relates generally to semiconductor processing, and more particularly to semiconductor workpiece holder and processing chambers using the same.

2. Description of the Related Art

Tube furnaces are widely used in semiconductor processing for a variety of different types of process steps. Examples of tube furnace processes are legion and include devices suited for chemical vapor deposition ("CVD"), annealing, and oxidation to name just a few. In many conventional tube reactors, scores of semiconductor wafers are positioned in a rack or boat composed of quartz. Conventional boat designs usually consist of three or more rails connected at each end to a cap. The rails are spaced apart and provided with a plurality of laterally spaced rings or inwardly projecting tabs that are designed to support the wafers. After loading, the boat is positioned in the reactor and, depending upon the particular process involved, reactive gases are introduced therein and exhausted therefrom.

Conventional boat designs exhibit several disadvantages. In those conventional boat designs that include a plurality of vertically spaced rings for supporting individual wafers, the rings themselves are subject to frequent fracture and warping as a result of thermal stresses. A fractured ring requires the boat to be taken out of service and subjected to a time intensive and costly repair procedures. Ring warping can skew the characteristics of films deposited on the wafer. This skewing in film properties stems largely from the fact that many types of CVD processes are mass transfer limited. In such processes, the pitch or spacing between the wafers in the boat is critical in order to reduce the impact of mass transfer limitations. If one or more rings supporting the wafers become warped, the critical spacing may be changed and result in poor film quality during deposition.

In those conventional designs that incorporate inwardly projecting tabs in lieu of rings, there remains the problem of localized cooling of the wafers as a result of conductive heat transfer between the wafer and the tabs. Conventional tab designs present a relatively large footprint in contact with the wafer, resulting in conductive heat transfer that is sufficient to produce a localized cooling of the wafer. This localized cooling produces a perturbation in the boundary layer formation in the vicinity of the tab. The disruption in the boundary layer formation can again lead to unanticipated film characteristics, particularly in mass transfer limited reactions, such as high temperature and medium temperature oxidation processes.

The present invention is directed to overcoming or reducing the effects of one or more of the foregoing disadvantages.

SUMMARY OF THE INVENTION

In accordance with one aspect of the present invention, an apparatus is provided that includes a first base, a second base and three elongated members coupled to and between the first base and the second base. The three elongated members are spatially arranged so that a semiconductor workpiece may be positioned therebetween. Each of the elongated members has a first lateral edge, a second lateral edge and at least one radially inwardly projecting member. The at least one radially inwardly projecting member has a third lateral edge, a fourth lateral edge and an upper surface for receiving a portion of the semiconductor workpiece and a lower surface. The third lateral edge is displaced laterally inward from the first lateral edge and the fourth lateral edge is displaced laterally inward from the second lateral edge.

In accordance with another aspect of the present invention, an apparatus is provided that includes a processing chamber for processing at least one semiconductor workpiece. A rack is positioned in the processing reactor for holding the at least one semiconductor workpiece. The rack has a first base, a second base, and three elongated members coupled to and between the first base and the second base. The three elongated members are spatially arranged so that at least one semiconductor workpiece may be positioned therebetween. Each of the elongated members has a first lateral edge, a second lateral edge and at least one radially inwardly projecting member. The at least one radially inwardly projecting member has a third lateral edge, a fourth lateral edge and an upper surface for receiving a portion of the at least one semiconductor workpiece and a lower surface. The third lateral edge is displaced laterally inward from the first lateral edge and the fourth lateral edge is displaced laterally inward from the second lateral edge.

In accordance with another aspect of the present invention, an apparatus is provided that includes a first quartz base, a second quartz base and three elongated quartz members coupled to and between the first quartz base and the second quartz base. The three elongated quartz members are spatially arranged so that a plurality of semiconductor workpieces may be positioned therebetween in spaced-apart relation. Each of the elongated quartz members has a first lateral edge, a second lateral edge and a plurality of radially inwardly projecting members. Each of the plurality of radially inwardly projecting members has a third lateral edge, a fourth lateral edge and an upper surface for receiving a portion of one of the plurality of semiconductor workpieces and a lower surface. The third lateral edge is displaced laterally inward from the first lateral edge and the fourth lateral edge is displaced laterally inward from the second lateral edge.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
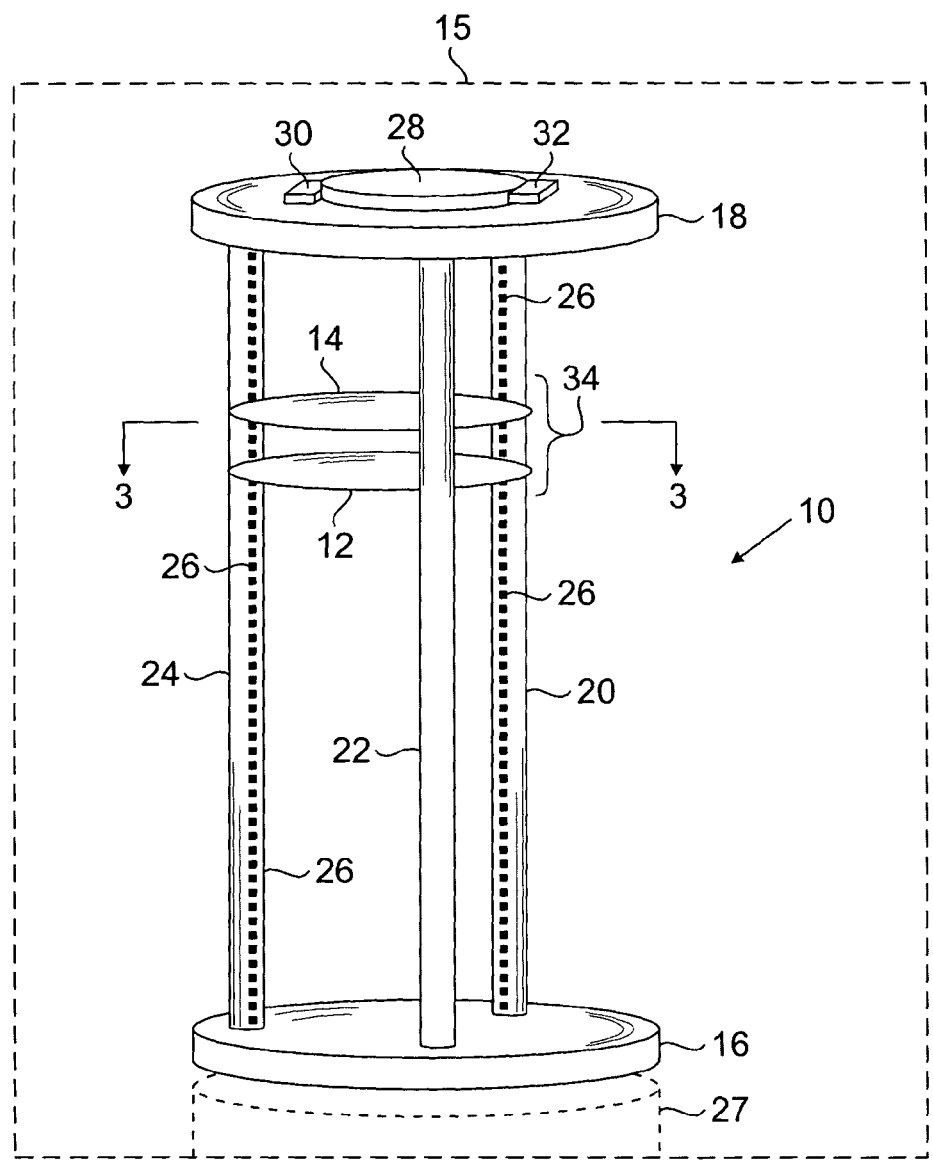
FIG. 1 is a pictorial view of an exemplary embodiment of an apparatus suitable for holding one or more semiconductor workpieces in accordance with the present invention.

In the drawings described below, reference numerals are generally repeated where identical elements appear in more than one figure. Turning now to the drawings, and in particular to FIG. 1, therein is shown a pictorial view of an exemplary embodiment of an apparatus 10 suitable for holding one or more semiconductor workpieces 12, 14. The apparatus 10 is commonly referred to in the industry as a rack or boat. Only two workpieces 12 and 14 are shown for simplicity of illustration. However, the number of semiconductor workpieces 12, 14 that may be held by the boat 10 is variable. It is envisioned that the boat 10 may be configured to hold one or up to many scores of workpieces as desired. The semiconductor workpieces 12, 14 may be semiconductor wafers, semiconductor-on-insulator wafers, or virtually any other type of workpiece used in circuit manufacture.

The boat 10 is designed to be inserted into a processing chamber 15. The processing chamber 15 may be any of a variety of chambers used in semiconductor processing, such as, for example, CVD chambers, low pressure CVD chambers, plasma enhanced CVD chambers, annealing chambers, oxidation chambers or the like.

The boat 10 consists of a disk-like base 16, a disk-like base 18, and three or more elongated members or rods 20, 22 and 24 coupled between the bases 16 and 18. The rods, 20, 22 and 24 are spatially arranged so that the semiconductor workpieces 12, 14 may be positioned therebetween. In order to support the semiconductor workpieces 12, 14, each of the rods 20, 22 and 24 is provided with one or more radially inwardly projecting members 26. The set of members 26 for the rod 22 is not visible in FIG. 1. The structure and function of the members 26 will be described in more detail below in conjunction with FIGS. 2, 3 and 4. The pictorial view in FIG. 1 actually depicts the boat 10 upside down to reveal the underside structure of the base 18. When inserted into the processing chamber 15, the base 18 of the boat 10 is positioned on a pedestal 27. To facilitate seating of the base 18 on the pedestal 27 the base 18 may be provided with a projecting flange 28 and one or more alignment shims 30 and 32.

The various structures of the boat 10 may be fabricated from, for example, quartz, silicon, silicon carbide or the like. The materials selected for the various structures of the boat 10 are generally selected for their relative chemical inertness. The various structural members of the boat 10 may be joined by welding, adhesives or the like. For example, where the bases 16 and 18 and the members 20, 22 and 24 are composed of quartz, the members 20, 22 and 24 may be joined to the bases 16 and 18 by well-known glass welding techniques Optionally, the entire boat 10 may be integrally formed.

Figure 2:
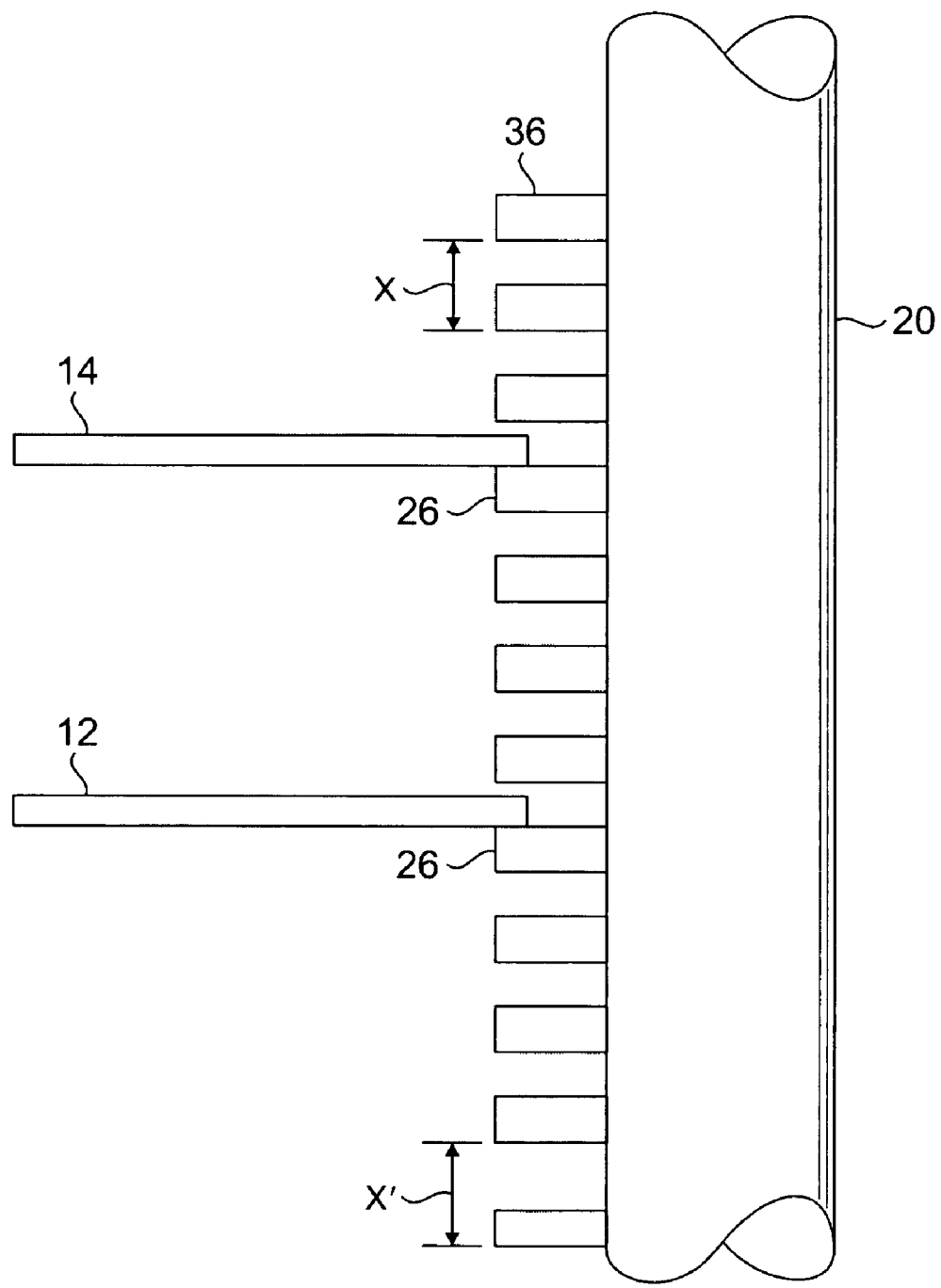
FIG. 2 is a magnified side view of a selected portion of FIG. 1 in accordance with the present invention.
Figure 3:
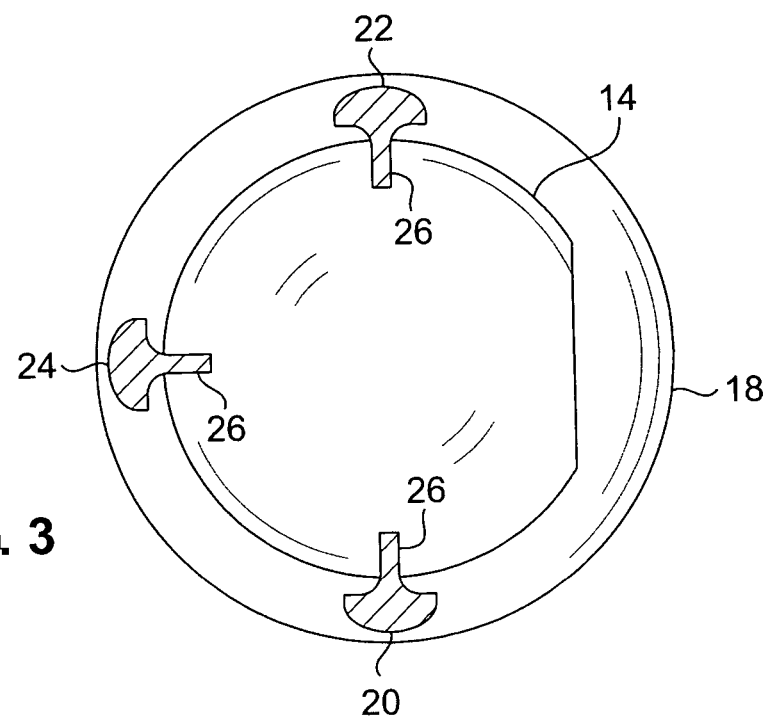
FIG. 3 is a cross-sectional view of FIG. 1 taken at section 3-3 in accordance with the present invention.

To better illustrate the structure and function of the inwardly projecting members 26, a side view of a selected portion 34 of FIG. 1 that includes portions of the member 20 and the semiconductor workpieces 12 and 14 is illustrated at a higher magnification in FIG. 2. The description of the structure and function of any one of the members, e.g., 20, 22 or 24, is illustrative of the other members. It is helpful at this point to refer also to FIG. 3, which is a cross-sectional view of FIG. 1 taken at section 3-3. Note that the section for FIG. 3 is taken through the portions of the members 20, 22 and 24 such that their respective inwardly projecting members 26 that physically support the semiconductor workpiece 14 are also shown in section. As shown in FIG. 2, each of the inwardly projecting members 26 includes an upper surface 36 for receiving a portion of one of the semiconductor workpieces 12, 14. The members 26 may be integrally formed with the member 20 or formed separately and coupled thereto by welding, adhesives or other well-known fastening techniques.

The spacing or pitch X between adjacent of the members 26 may be tailored as necessary to accommodate the particular reaction kinetics for the processes in which the boat 10 will be used. The skilled artisan will appreciate that in reactions that are mass transfer limited, such as, for example, medium and high temperature oxide CVD through the reaction of silane and nitrous oxide, the pitch X may be selected to satisfy the Theile modulus requirements for the reaction in question. The pitch between adjacent members 26 may be the same. Optionally, some of the members 26 may be spaced with a pitch X and others with another pitch X'. Providing different pitches may be desirable where, for example, it is necessary to compensate for a smaller than expected flat zone in the processing chamber 15 (See FIG. 1).

The configuration of the inwardly projecting members 26 is selected to provide a highly thermally resistive, that is, less thermally conductive heat transfer pathway from the semiconductor workpieces 12, 14 to the boat 10. This is accomplished by providing the members 26 with a footprint that is substantially reduced over that provided by conventional boat designs. As shown more clearly in FIG. 4, which is a magnified view of a portion of FIG. 3 that encompasses the rod 22 and a portion of the semiconductor workpiece 14, the rod 22 includes lateral edges 38 and 40. The reduced profile of the inwardly projecting member 26 is provided by forming it with lateral edges 42 and 44 that are inwardly displaced respectively from the lateral edges 38 and 40 of the rod 22. This smaller footprint for the inwardly projecting member 26 provides more thermal resistance against conductive heat transfer between the semiconductor workpiece 14 and the member 26. This diminished thermal conduction will reduce the localized cooling of the semiconductor workpiece 14 in the vicinity of the rods 20, 22 and 24, which will thereby reduce the impact on boundary layer formation during the processing of the workpieces 12 and 14. This reduction in the impact on boundary layer formation is of great importance in mass transfer limited reactions.

Figure 4:
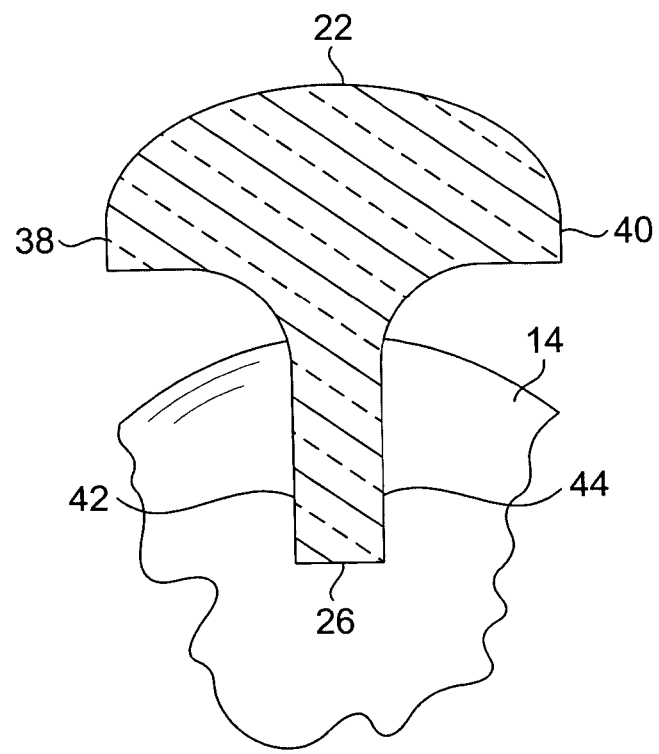
FIG. 4 is a magnified view of a selected portion of FIG. 3 that includes a radially inwardly projecting support member in accordance with the present invention.
Figure 5:
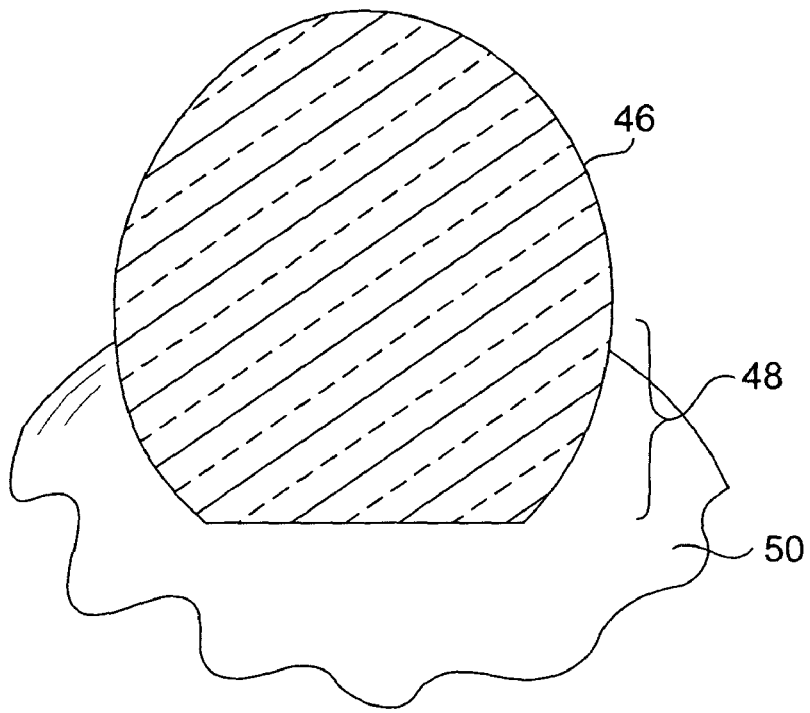
FIG. 5 is cross-sectional view like FIG. 4, but depicts an exemplary conventional support member.

The configuration of the rods and in particular the members 26 may be contrasted with a conventional rod design depicted in FIG. 5. FIG. 5 is a cross-sectional view of similar perspective as FIG. 4. The conventional rod 46 depicted in FIG. 5 includes a region 48 that is responsible for physically supporting a semiconductor workpiece 50. The relatively large surface contact area between the portion 48 of the rod 46 and the workpiece 50 can lead to significant boundary layer formation as a result of conductive heat transfer during chemical reaction. This can lead to localized distortions in the properties of the films formed on the workpiece 50 near the rod 46.

Figure 6:
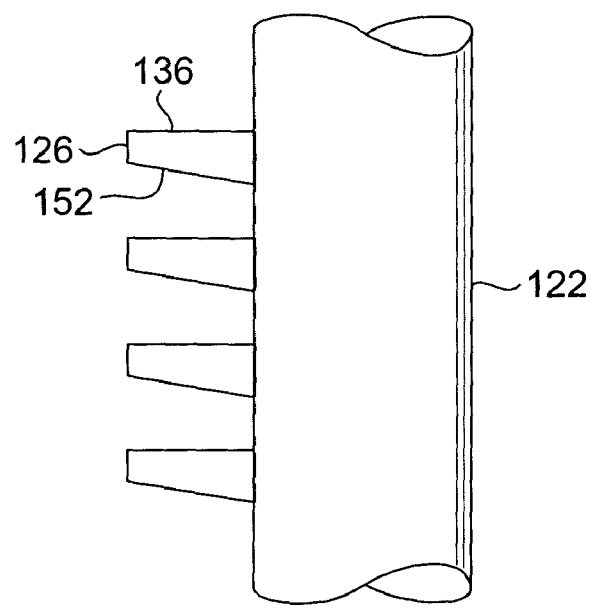
FIG. 6 is a side view like FIG. 2, but depicts an alternate exemplary embodiment of the apparatus in accordance with the present invention.

Alternate exemplary embodiments are envisioned in which the structure of the inwardly projecting members is altered to provide even greater resistance to conductive heat transfer. A first alternate exemplary embodiment is illustrated in FIG. 6, which is a side view from the same general perspective as FIG. 2, albeit without showing one of the semiconductor workpieces 12,14. In this illustrative embodiment, the member 122 may be provided with one or more radially inwardly projecting members 126 as generally described above. The upper surface 136 of each member 126 may be substantially flat in order to accommodate a semiconductor workpiece. However, in this illustrative embodiment, the members 126 may be provided with a tapered under surface 152. In this way, the overall bulk of each of the members 126 is reduced over that provided by a more symmetric, rectangular configuration.

Figure 7:
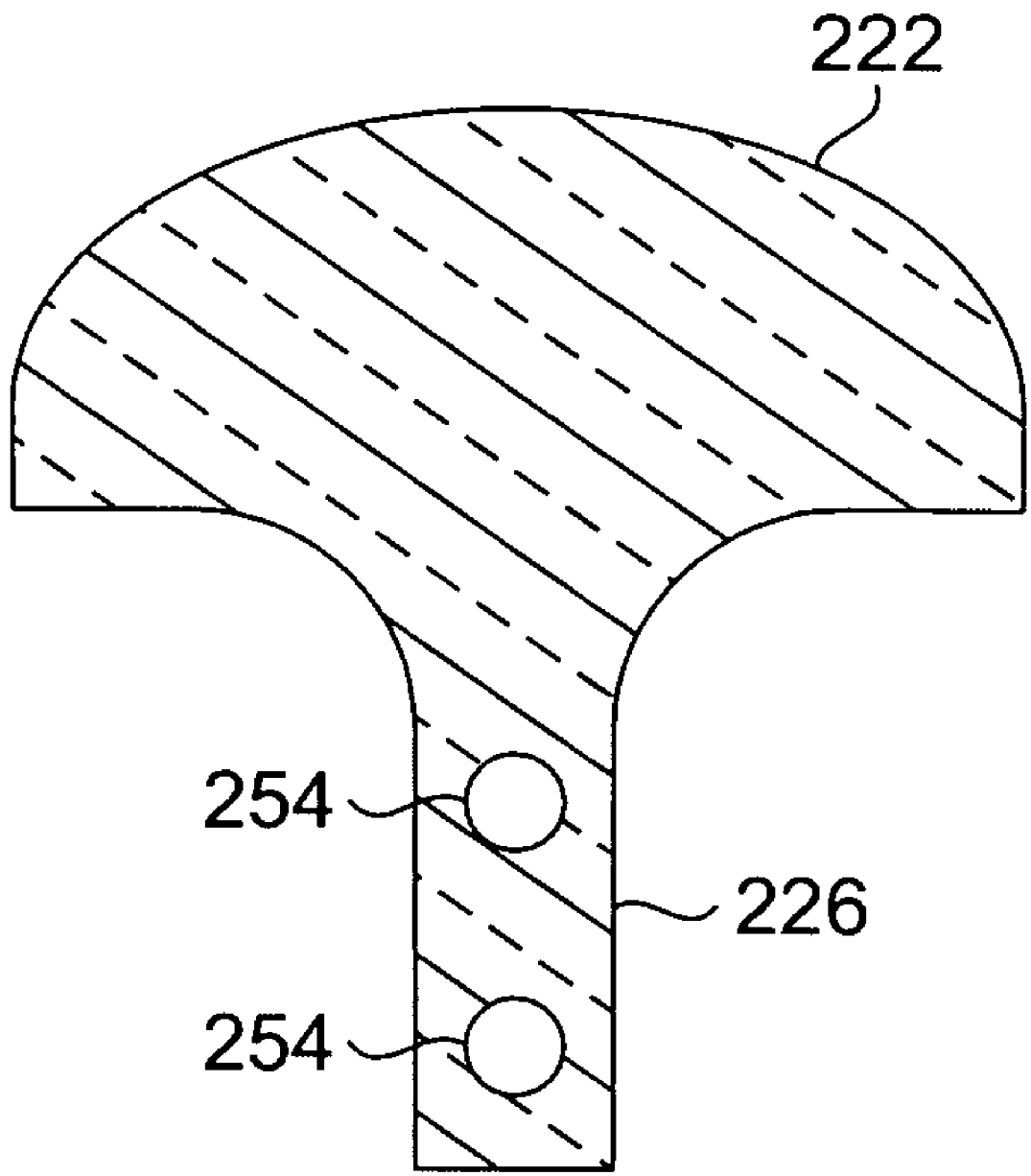
FIG. 7 is a cross-sectional view like FIG. 4, but depicts another alternate exemplary embodiment of the apparatus in accordance with the present invention.

Another alternate exemplary embodiment incorporating structural features to add greater resistance to thermal conduction is shown in FIG. 7, which is a cross-sectional view taken from the same general perspective as FIG. 4, albeit without depicting one of the semiconductor workpieces 12,14. In this illustrative embodiment, the member 222 is provided with an inwardly projecting member 226 as generally described above. However, one or more holes 254 may be provided in the member 226 in order to reduce the bulk and thus the heat transfer capability of the member 226. The number and configuration of the holes 254 is largely a matter of design discretion. If desired, both tapered profiling and holes may be incorporated into the members 226.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   three elongated members spatially arranged so that at least one semiconductor workpiece may be positioned there between;
   one or more reduced profile support members projecting radially inwardly from each of the elongated members, each of the reduced profile support members comprising:
      an upper surface for receiving a portion of the at least one semiconductor workpiece;
      an under surface;
      a first lateral edge; and
      a second lateral edge, wherein each of the elongated members comprises a width substantially greater than a width of the one or more reduced profile support members projecting radially inwardly therefrom.

2. The apparatus of claim 1, further comprising a processing chamber, wherein said three elongated members comprise a rack within the processing chamber, and wherein the processing chamber comprises a chemical vapor deposition chamber.

3. The apparatus of claim 1, further comprising a processing chamber, wherein said three elongated members comprise a rack within the processing chamber, and wherein the processing chamber comprises a furnace.

4. The apparatus of claim 1, wherein the three elongated members comprise quartz.

5. The apparatus of claim 4, wherein three elongated members are coupled between a first base and a second base, and wherein the first base and the second base comprise quartz.

6. The apparatus of claim 1, wherein the one or more reduced profile support members includes a hole.

7. The apparatus of claim 1, wherein the under surface comprises a tapered surface.

8. The apparatus of claim 1, wherein each of elongated members comprises a plurality of spaced-apart reduced profile support members.

9. The apparatus of claim 8, wherein each of the reduced profile support members includes a first pitch.

10. The apparatus of claim 8, wherein a first portion of the reduced profile support members includes a first pitch and a second portion of the reduced profile support members includes a second pitch.

11. An apparatus, comprising:
    a processing chamber for processing at least one semiconductor workpiece;
    a rack positioned in the processing chamber, the rack comprising three elongated members spatially arranged so that the at least one semiconductor workpiece may be positioned there between, wherein the rack has a first base coupled to a first end of the three elongated members and a second base coupled to a second end of the three elongated members; and
    one or more reduced profile support members projecting radially inwardly from each of the elongated members, each of the reduced profile support members comprising:
      an upper surface for receiving a portion of the at least one semiconductor workpiece;
      an under surface;
      a first lateral edge; and
      a second lateral edge, wherein each of the elongated members comprises a width substantially greater than a width of the one or more reduced profile support members projecting radially inwardly therefrom.

12. The apparatus of claim 11 wherein the processing chamber comprises a chemical vapor deposition chamber.

13. The apparatus of claim 11 wherein the processing chamber comprises a furnace.

14. The apparatus of claim 11 wherein the three elongated members comprise quartz.

15. The apparatus of claim 14, wherein the first base and the second base comprise quartz.

16. The apparatus of claim 11, wherein the one or more reduced profile support members includes a hole.

17. The apparatus of claim 11 wherein the under surface comprises a tapered surface.

18. The apparatus of claim 11 wherein each of elongated members comprises a plurality of reduced profile support members.

19. The apparatus of claim 18, wherein each of the reduced profile support members includes a first pitch.

20. The apparatus of claim 18, wherein a first portion of the one or more reduced profile support members includes a first pitch and a second portion of the one or more reduced profile support members includes a second pitch.

* * * * *

UNITED STATES PATENT AND TRADEMARK OFFICE
CERTIFICATE OF CORRECTION

| | | |
|---|---|---|
| PATENT NO. | : 8,323,411 B2 | |
| APPLICATION NO. | : 11/145617 | |
| DATED | : December 4, 2012 | |
| INVENTOR(S) | : Loo | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1601 days.

Signed and Sealed this
Thirtieth Day of September, 2014

Michelle K. Lee
*Deputy Director of the United States Patent and Trademark Office*